United States Patent
Langer et al.

(10) Patent No.: US 7,518,391 B2
(45) Date of Patent: Apr. 14, 2009

(54) PROBE CARD AND A METHOD FOR DETECTING DEFECTS USING A PROBE CARD AND AN ADDITIONAL INSPECTION

(75) Inventors: Moshe Langer, Nes Ziona (IL); Ehud Tirosh, Mevaseret Zion (IL)

(73) Assignee: Applied Materials, Israel, Ltd., Rehovot (IL)

( * ) Notice: Subject to any disclaimer, the term of this patent is extended or adjusted under 35 U.S.C. 154(b) by 21 days.

(21) Appl. No.: 11/059,141

(22) Filed: Feb. 15, 2005

(65) Prior Publication Data

US 2005/0278134 A1 Dec. 15, 2005

Related U.S. Application Data

(60) Provisional application No. 60/545,735, filed on Feb. 17, 2004, provisional application No. 60/590,551, filed on Jul. 23, 2004, provisional application No. 60/590,656, filed on Jul. 23, 2004.

(51) Int. Cl.
*G01R 31/26* (2006.01)
*G01R 31/02* (2006.01)

(52) U.S. Cl. .................................. 324/765; 324/754

(58) Field of Classification Search .................. None
See application file for complete search history.

(56) References Cited

U.S. PATENT DOCUMENTS

| | | | |
|---|---|---|---|
| 4,873,623 A * | 10/1989 | Lane et al. ............. 700/83 |
| 4,978,908 A * | 12/1990 | Mahant-Shetti et al. ..... 324/751 |
| 5,712,571 A * | 1/1998 | O'Donoghue ............... 324/539 |
| 6,294,397 B1 * | 9/2001 | Jarvis et al. .................. 438/17 |
| 6,433,561 B1 * | 8/2002 | Satya et al. .................. 324/753 |
| 6,563,330 B1 | 5/2003 | Maruyama et al. |
| 6,642,729 B2 | 11/2003 | Kang et al. |
| 6,708,132 B1 * | 3/2004 | Gutierrez et al. ............. 702/117 |
| 6,714,828 B2 | 3/2004 | Eldridge et al. |
| 6,771,077 B2 * | 8/2004 | Hamamura et al. ......... 324/537 |
| 6,788,082 B2 | 9/2004 | Hirao |
| 6,859,031 B2 * | 2/2005 | Pakdaman et al. .......... 324/233 |
| 6,914,443 B2 * | 7/2005 | Litman et al. ............... 324/751 |
| 6,995,566 B2 * | 2/2006 | Yamaoka et al. ............ 324/519 |
| 7,015,711 B2 * | 3/2006 | Rothaug et al. ............. 324/758 |
| 7,088,107 B2 * | 8/2006 | Yamaoka et al. ............ 324/537 |
| 2005/0085032 A1 * | 4/2005 | Aghababazadeh et al. .. 438/232 |
| 2006/0192904 A1 * | 8/2006 | Almogy et al. ................. 349/6 |
| 2007/0267632 A1 * | 11/2007 | Bullock ........................ 257/48 |

* cited by examiner

*Primary Examiner*—Paresh Patel
(74) *Attorney, Agent, or Firm*—Tarek N. Fahmi

(57) ABSTRACT

A method and system for defect localization including (i) receiving a test structure that includes at least one conductor that is at least partially covered by an electro-optically active material; (ii) providing an electrical signal to the conductor, so as to charge at least a portion of the conductor; and (iii) imaging the test structure to locate a defect.

7 Claims, 12 Drawing Sheets providing a probe card that includes a pins area that is positioned near a perimeter of the probe card
405 supplying, by a probe card, at least one electrical signal to a first set of test structure pads and viewing a first set of test structures that are connected to the first set of test structure pads
410 introducing a relative movement between the probe card and the test structure array
420 supplying, by a probe card, at least one electrical signal to a second set of test structure pads and viewing a second set of test structures that are coupled to the second set of test structure pads
430

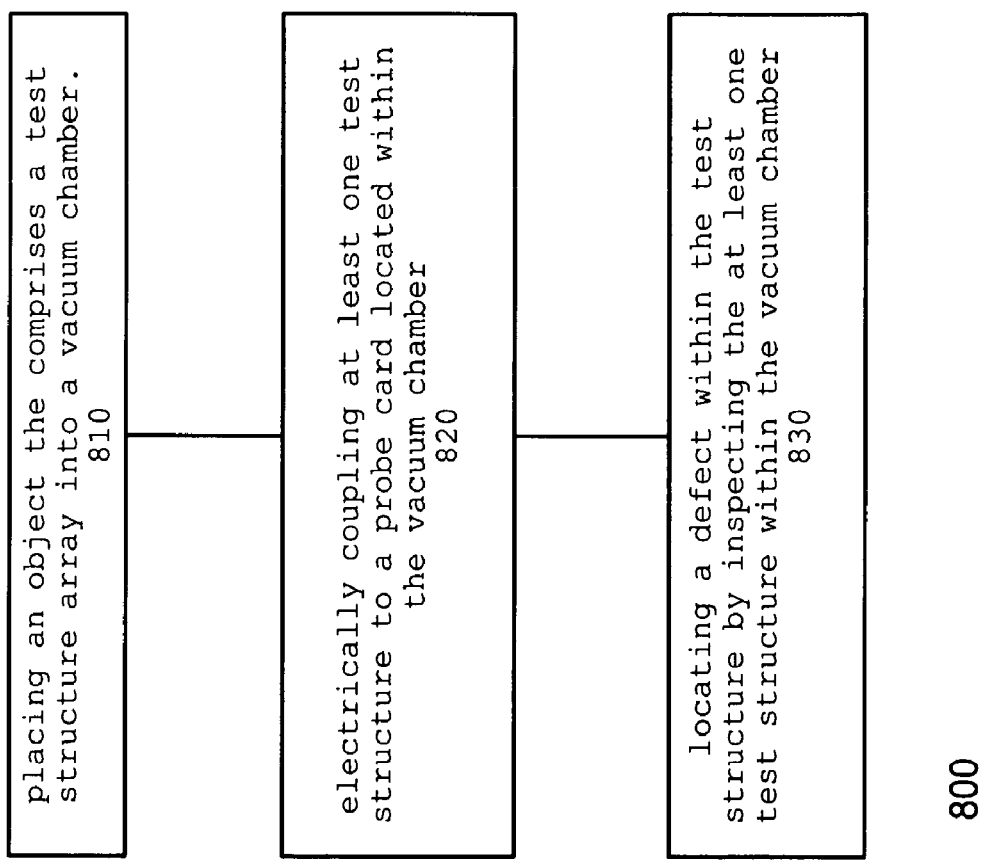

PROBE CARD AND A METHOD FOR DETECTING DEFECTS USING A PROBE CARD AND AN ADDITIONAL INSPECTION

RELATED APPLICATIONS

This application is claims the priority benefit of and is a non-provisional of U.S. Provisional Application 60/545,735, filed Feb. 17, 2004; U.S. Provisional Application 60/590,551, filed Jul. 23, 2004; and U.S. Provisional Application 60/590, 656, filed Jul. 23, 2004.

FIELD OF THE INVENTION

This invention relates to methods and systems for defect localization and especially for defects, including both hard defects and soft defects, that occur within electrical test structures used in micro-fabrication.

BACKGROUND OF THE INVENTION

Test structures are fabricated in order to enhance defect detection and/or analysis of micro-fabrication manufacturing process. Test structures may be included in a variety of objects, such as but not limited to integrated circuits, masks (for fabricating integrated circuits, flat panel displays and the like), MEMS devices and the like. They may be located at various locations on these objects, such as in the integrated circuit die or in scribe lines on semiconductor wafers.

In many cases the size of a defect is much smaller than the size of the test structure and the second stage of locating the defect is time consuming, especially in the context of integrated circuit manufacturing, and failure analysis devices, such as Defect Review Scanning Electron Microscope (DR-SEM) that are utilized during said manufacturing process.

Usually, test structures include one, two or more electrical conductors that may be shaped in various manners, such as a comb, serpentine, nest, via chain and the like that are known in the art. A defective test structure may be characterized by hard defects (electrical short or electrical open, i.e. isolated) and soft defects (high resistance vias or shorts resulting from metal threads or stringers).

Various devices exist for defect detection and defect analysis. A tester can perform various electrical tests by connecting a probe card to a test structure. A typical probe card includes multiple pins and can perform complex electrical tests.

A defect localization system locates defects, usually after the tester finds defective test structures, and usually uses a small and simple prober. A prober has typically two needles, and being small, it is used for simple functions (such as resistance measurement). Due to its small size it does not substantially interfere with test structure imaging. Defect analysis devices usually mill defects or their vicinity.

Some prior art defect localization methods require to connect a tested wafer to a probe card and also to be inspected. These prior art methods can involve using an electrical beam, a laser beam, an infra-red beam and the like.

Various vendors offer testing devices that include probe cards. These vendors include, for example, Cascade Microtech Inc. of the United States, SV Probe of San Jose, Calif., and the like.

The following U.S. patents and patent applications provide a brief overview of state of the art probe cards: U.S. Pat. Nos. 6,563,330 and 6,774,650 of Maruyama et al., titled "Probe card and method of testing wafer having a plurality of semiconductor devices"; U.S. Pat. No. 6,642,729 of Kang et al., titled "Probe card for tester head"; U.S. Pat. No. 6,714,828 of Eldridge et al., titled "Method and system for designing a probe card"; and U.S Pat. No. 6,788,082 of Hirao titled "probe card".

FIG. 1 illustrates a prior art probe card 10. The round-shaped probe card 10 includes multiple pins (usually between thirty two pins and two hundred and fifty two pins) 20 that are located at small pins area 22 that is positioned at the center of probe card 10. These pins 20 are connected by multiple connectors 24 to large probe card pads 26. The large probe card pads 26 are located near the perimeter of the probe card 10. The multiple connectors 24 define an annular area 28 that is usually much larger than the pins area 22. The large probe card pads are contacted by connectors of a dedicated tester device that can read signals and provide signals via these pads.

FIG. 2 illustrates a typical test structure array 30. Test structure array 30 includes two columns of test structures (collectively denoted 34 and 134) and two columns of test structure pads (collectively denoted 32 and 132). Each test structure is connected to a small test structure pad that in turn is designed such to make contact with a pin out of multiple pins 20 of the probe card 10. The two columns of test structure pads 32 and 132 are located at the center of the test structure array 30.

During a defect localization process, the test structures should be scanned while the corresponding test structure pads should be connected to pins 20 in order to receive appropriate voltage.

FIG. 3 is a cross sectional view of a probe card 10 of FIG. 1 that is connected to the test structure array 30 of FIG. 2. As can seen by FIG. 3, when the pins in pin area 22 are connected to the test structure pads 32 and/or 132 the probe card 10 blocks scanning beams, and thus prevents the imaging of relatively large areas of the test structure array 30 which are adjacent to the test structure pads.

There is a need to provide a probe card and a method for allowing efficient defect localization.

SUMMARY OF THE INVENTION

The invention provides a method for defect localization, the method includes the stages of: (i) placing an object that comprises multiple test structures into a vacuum chamber; (ii) electrically coupling at least one test structure to a probe card located within the vacuum chamber; and (iii) locating a defect within the test structure by inspecting the at least one test structure within the vacuum chamber.

A method for defect localization, the method includes: (i) supplying, by a probe card, at least one electrical signal to a first set of test structure pads and viewing a first set of test structures that are coupled to the first set of test structure pads; (ii) supplying, by a probe card, at least one electrical signal to a second set of test structure pads and viewing a second set of test structures that are coupled to the second set of test structure pads.

A probe card that includes: (i) multiple pins arranged within a pins area located at a vicinity of a perimeter of the probe card; and (ii) multiple electrical conductors, interconnecting the pins and multiple probe card pads.

A device for testing a test structure array, the device comprises: (i) at least one inspection unit adapted to inspect at least one test structure of the test structure array, and (ii) a probe card adapted to supply at least one signal to at least one test structure pad while allowing the at least one inspection unit to inspect the at least one test structure.

A method for defect detection, the method includes: determining that a test structure is defective, by a tester; locating a defect within the defective test structure by a defect localization unit; and analyzing the defect by an analysis device; wherein the tester, defect localization tool and the analysis device are integrated.

BRIEF DESCRIPTION OF THE DRAWINGS

In order to understand the invention and to see how it may be carried out in practice, a preferred embodiment will now be described, by way of non-limiting example examples only, with reference to the accompanying drawings, in which:

FIG. 9 is a flow chart of a method for defect localization, according to an embodiment of the invention;

FIG. 12 illustrates a method for defect localization according to another embodiment of the invention.

DETAILED DESCRIPTION

In the following detailed description of the preferred embodiments and other embodiments of the invention, reference is made to the accompanying drawings. It is to be understood that those of skill in the art will readily see other embodiments and changes may be made without departing from the scope of the invention.

Figure 4:
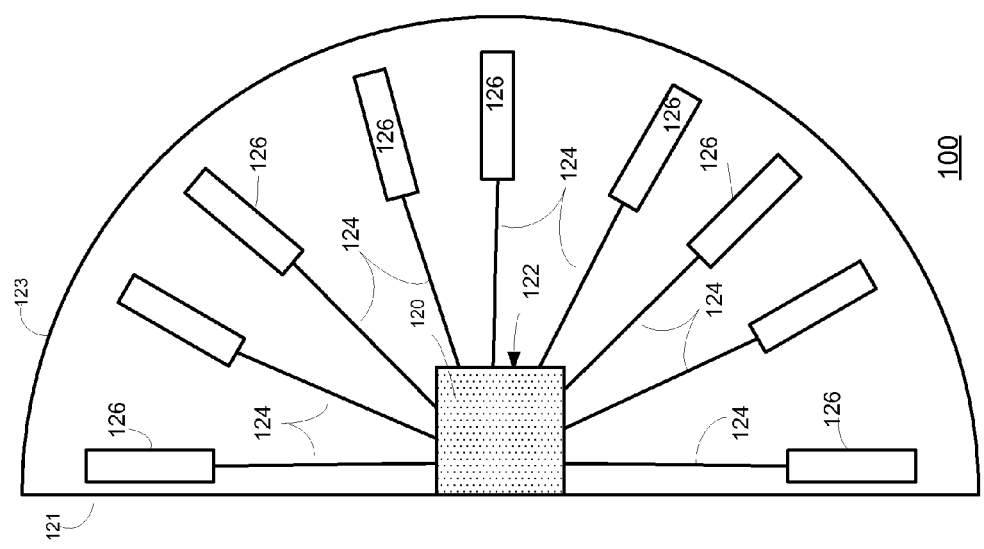
FIG. 4 illustrates a probe card, according to an embodiment of the invention.

FIG. 4 illustrates a probe card 100 according to an embodiment of the invention.

The probe card 100 is semi-circular and includes a straight perimeter 121 and an arched perimeter 123. The probe card 100 includes a pins area 122 that is positioned near the straight perimeter 121. Multiple pins 120 are located within the pins area 122 and are connected, via multiple connectors 124, to multiple large probe card pads 126. The large probe card pads 126 are located near the arched perimeter 123.

The proximity of the pins area 122 to a straight perimeter 121 allows the probe card 100 to contact a column of test structure pads (such as 32 or 132) and allowing the test structures that are connected to that column (such as 34 or 134) to be scanned. For example, while the probe card pins 120 contact a first column 32 of test structure pads, the test structures 34 can be scanned. It is noted that the probe card 100 may block the other test structures 134 from being scanned. It is further noted that the straight perimeter 121 may be placed above test structure pads 32, above test structure pads 132, above test structures 134, and the like.

It is noted that the probe card 100 can be shaped in other manners. For example, the arched perimeter 123 may be replaced by one or more differently shaped perimeters. The annularity of the arched perimeter 123 eases the connection to testers that were previously adapted to contact arched distributed large probe pads such as pads 26 of probe card 10.

According to an embodiment of the invention, the pins 120 can be connected to an interconnecting device or to wires that further extend from the straight perimeter 121 and contact the test structure pads without blocking the test structure pads.

Figure 1:
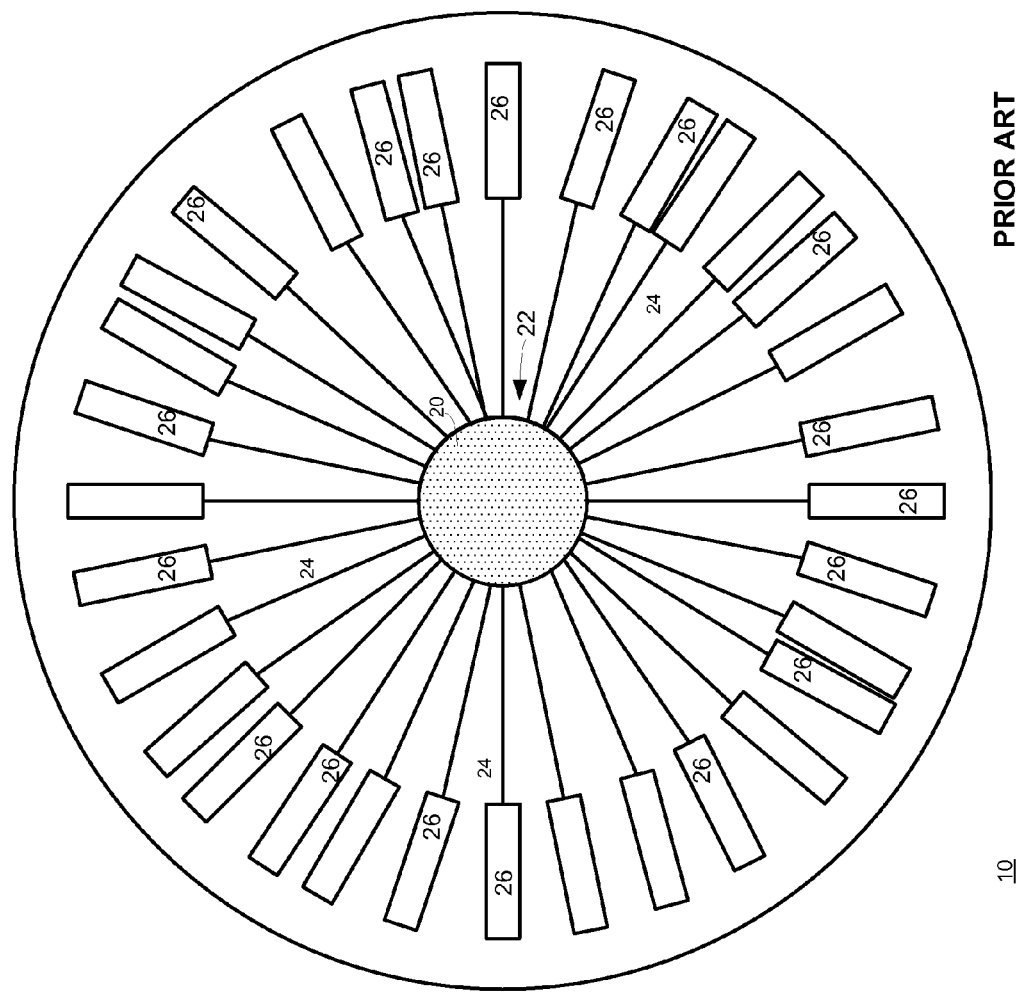
FIGS. 1-3 illustrate a prior art probe card and a test structure array.
Figure 2:
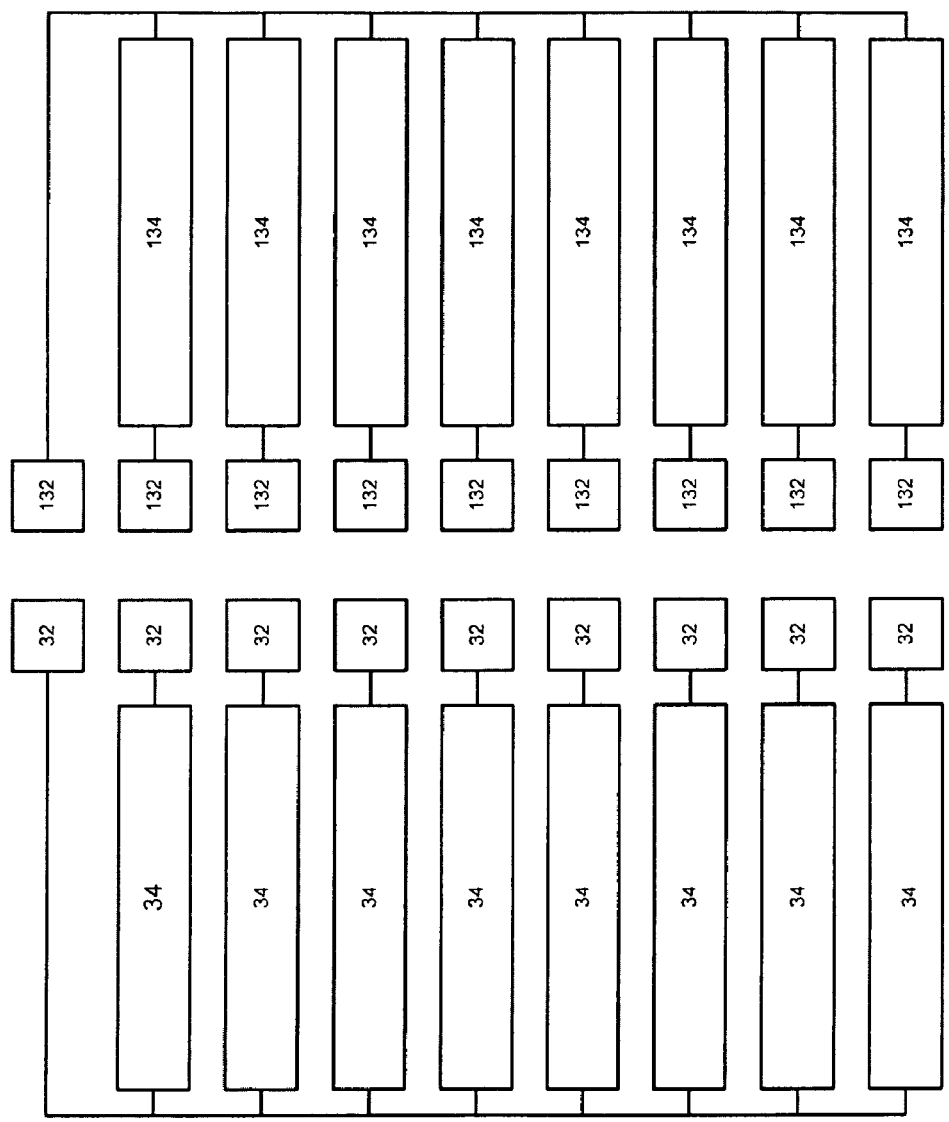
Figure 3:
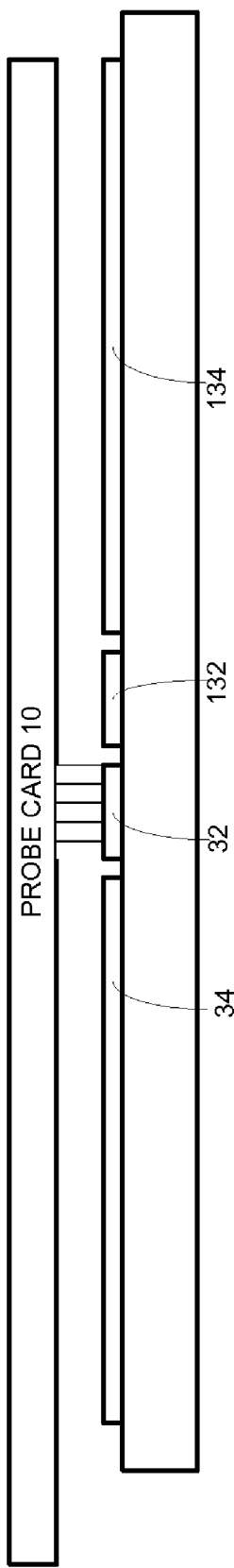
Figure 5:
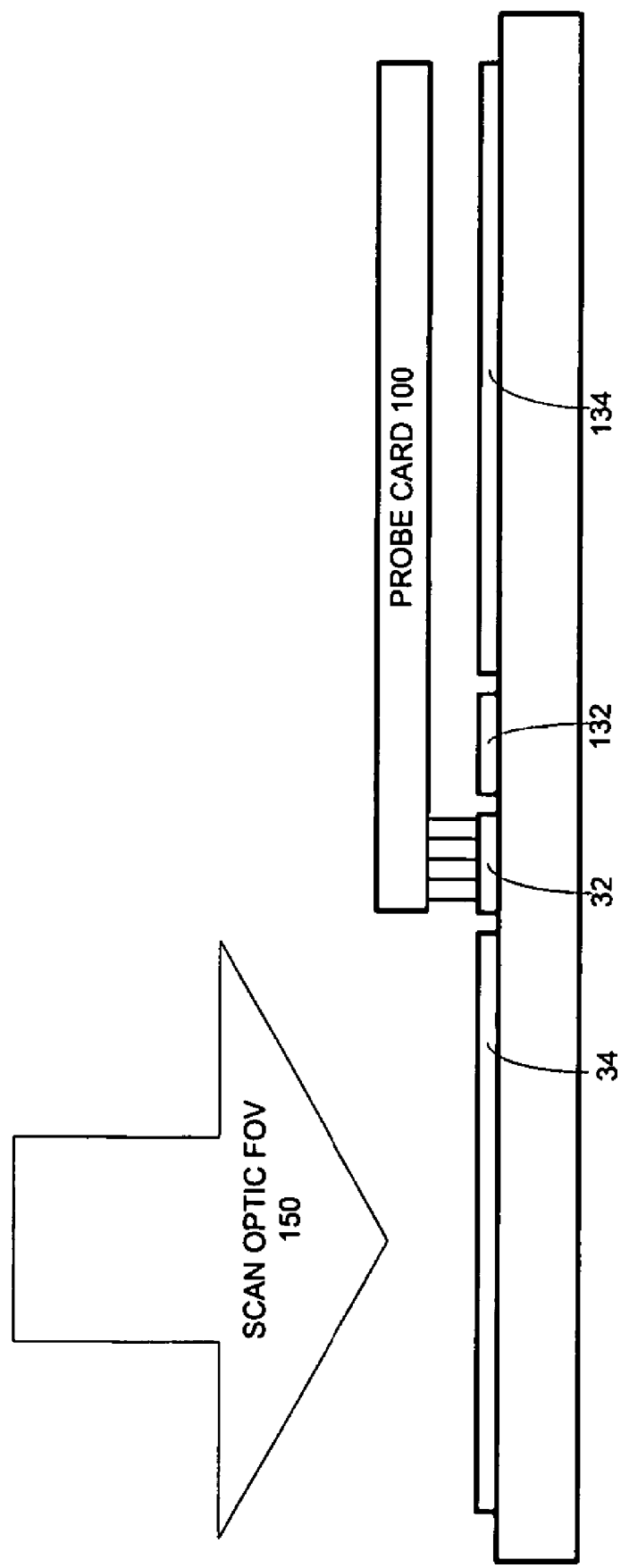
FIG. 5 is a cross sectional view of the probe card of FIG. 4 that is connected to a test structure of the test structure array of FIG. 2, according to an embodiment of the invention.

FIG. 5 is a cross sectional view of the probe card 100 of FIG. 4 that is connected to a test structure pad 32(1) of the test structure array 30 of FIG. 2, according to an embodiment of the invention. FIG. 5 illustrates a single test structure pad 32(1), but this is for simplicity of explanation alone.

When the pins 122 are connected to the test structure pads 32 (or 132) the probe card 100 does not block test structures 34 (or 134). The scanning (or otherwise imaging) of the un-blocked test structures is illustrated by a field of view denoted "scan optic FOV" 150.

Typically, after a first column 34 of test structures is scanned, the probe card can be rotated by 180°, or otherwise is moved such as to contact the second column 132 of test structure pads to allow the scanning of the second column 134 of test structures.

Figure 6:
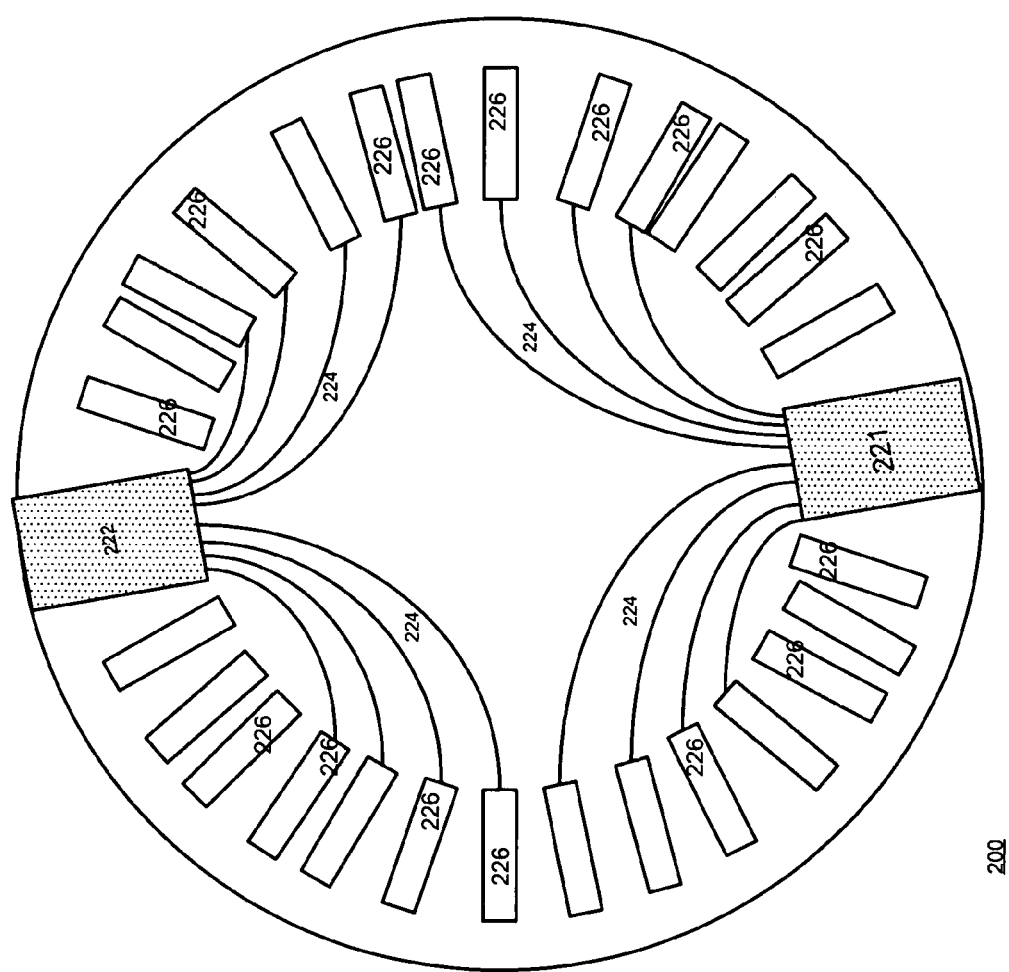
FIG. 6 illustrates a probe card, according to an embodiment of the invention.

FIG. 6 illustrates a probe card 200, according to an embodiment of the invention.

The probe card 200 is circular and includes two pins areas 221 and 222 that are positioned at opposite locations of the probe card 200, each near a perimeter of the probe card.

Connectors 224 connect pins within each of these areas to multiple large probe card pads 226. The large probe card pads 226 are located near the perimeter of probe card 200.

The provision of two pins areas 221 and 222 allows one to test the test structure array 30 by introducing linear movement between two inspection stages. The process starts by connecting the pins of pins area 221 to pads 32 and testing test structures 34, introducing a linear displacement between test structure array 30 and probe card 200 and connecting the pins of pins area 222 to pads 132 and testing test structures 134.

The shape of the probe card 200 as well as the shape of probe card 100 can vary without departing from the scope of the invention. For example, probe card 200 can have a rectangular shape.

Figure 7:
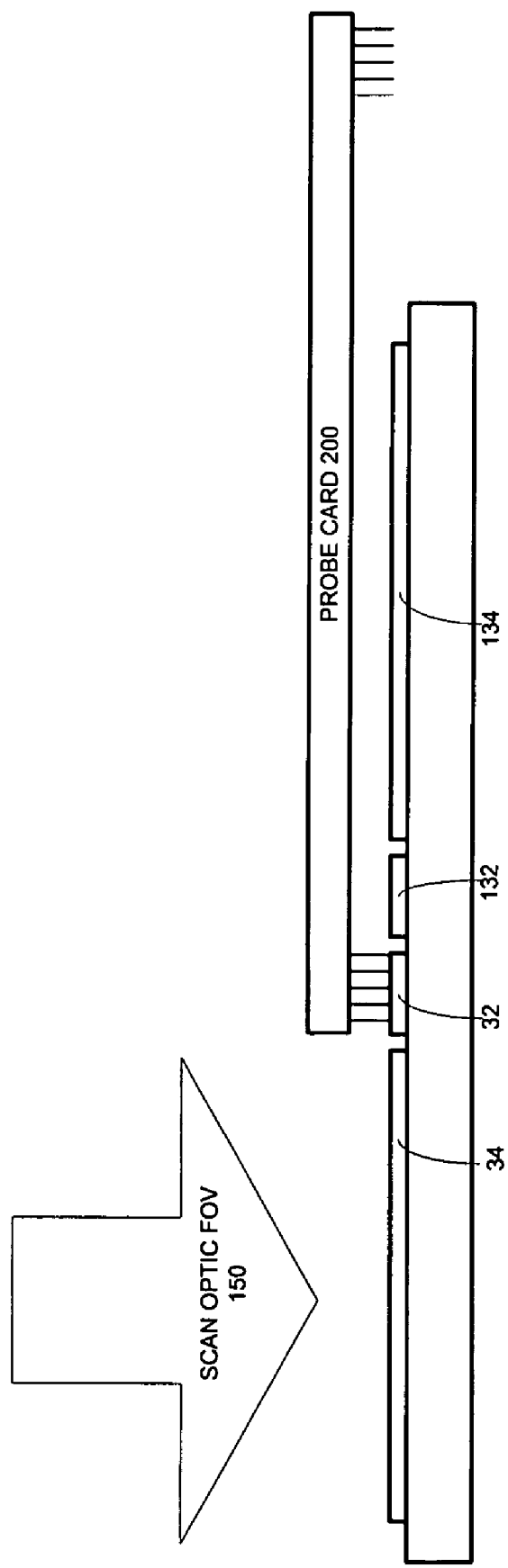
FIG. 7 is a cross sectional view of the probe card of FIG. 6 that is connected to a test structure of the test structure array of FIG. 2, according to an embodiment of the invention.

FIG. 7 is a cross sectional view of the probe card 200 of FIG. 6 that is connected to a test structure pad 32(1) of the test structure array 30 of FIG. 2, according to an embodiment of the invention. FIG. 7 illustrates a single test structure pad 32(1), but this is for simplicity of explanation alone.

FIG. 7 illustrates that the probe card 200 can contact pins of a certain test structure pads, while allowing to scan test structures that are connected to these pads.

Figure 8:
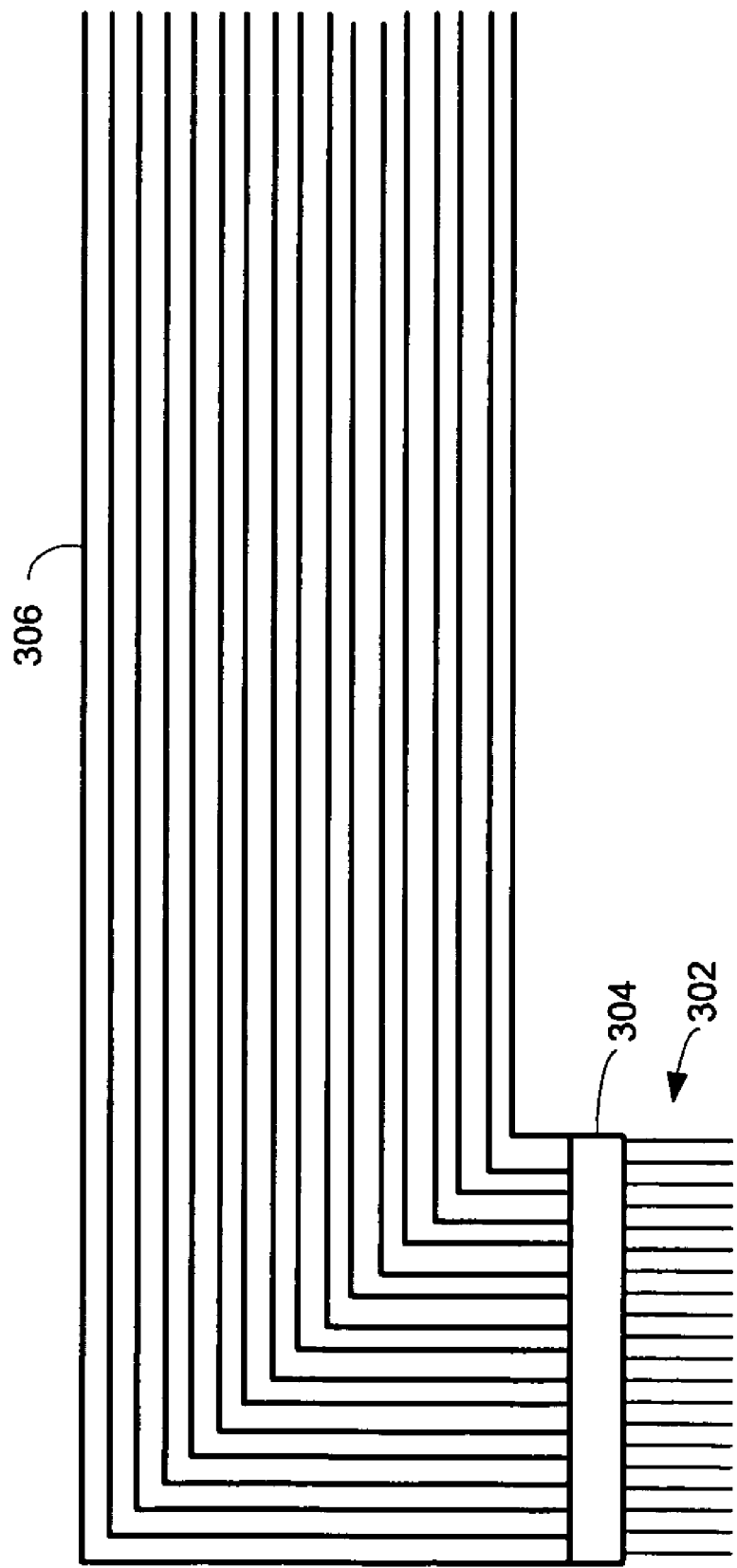
FIG. 8 illustrates an interconnecting device, according to an embodiment of the invention.

FIG. 8 illustrates an interconnecting device 300, according to an embodiment of the invention. The interconnecting device 300 includes an array of pins 302 that are fixed to a horizontal plate 304. These pins are connected via "L" shaped wires 306 that extend vertically and then horizontally. These wires 306 allows one to further move the probe card (100 or 200) away from the test structures and test structure pads. Wires 306 can be connected to large probe card pads such as 126 or 226.

FIG. 9 is a flow chart of a method 400 for defect localization, according to an embodiment of the invention.

Method 400 starts by stage 410 of supplying, by a probe card, at least one electrical signal to a first set of test structure pads and viewing a first set of test structures that are connected to the first set of test structure pads. Conveniently, during stage 410 a second set of test structures is concealed by the probe card. It is noted that the signals can be supplied by pins located within a pins area of a probe card.

Stage 410 is conveniently followed by stage 420 of introducing a relative movement between the probe card and the test structure array. Conveniently, this relative movement is a rotational movement. Conveniently, the relative movement is a linear movement. According to various embodiments of the invention, the relative movement can include a combination of linear and circular movements.

Stage 420 is followed by stage 430 of supplying, by a probe card, at least one electrical signal to a second set of test structure pads and viewing a second set of test structures that are coupled to the second set of test structure pads.

According to an embodiment of the invention, the first set of test structure pads comprises about half of the test structure pads of the test structure array.

Conveniently, method 400 includes stage 405 of providing a probe card that includes a pins area that is positioned near a perimeter of the probe card.

According to an embodiment of the invention, method 400 is applied within a vacuum chamber. Conveniently, the vacuum chamber also at least partially surrounds an optical tool column which is used to scan (or image) the test structures.

According to various embodiments of the invention, the test structures can be imaged or scanned by light or charged particles. The test structures can be scanned or imaged by pulsating light.

Figure 10:
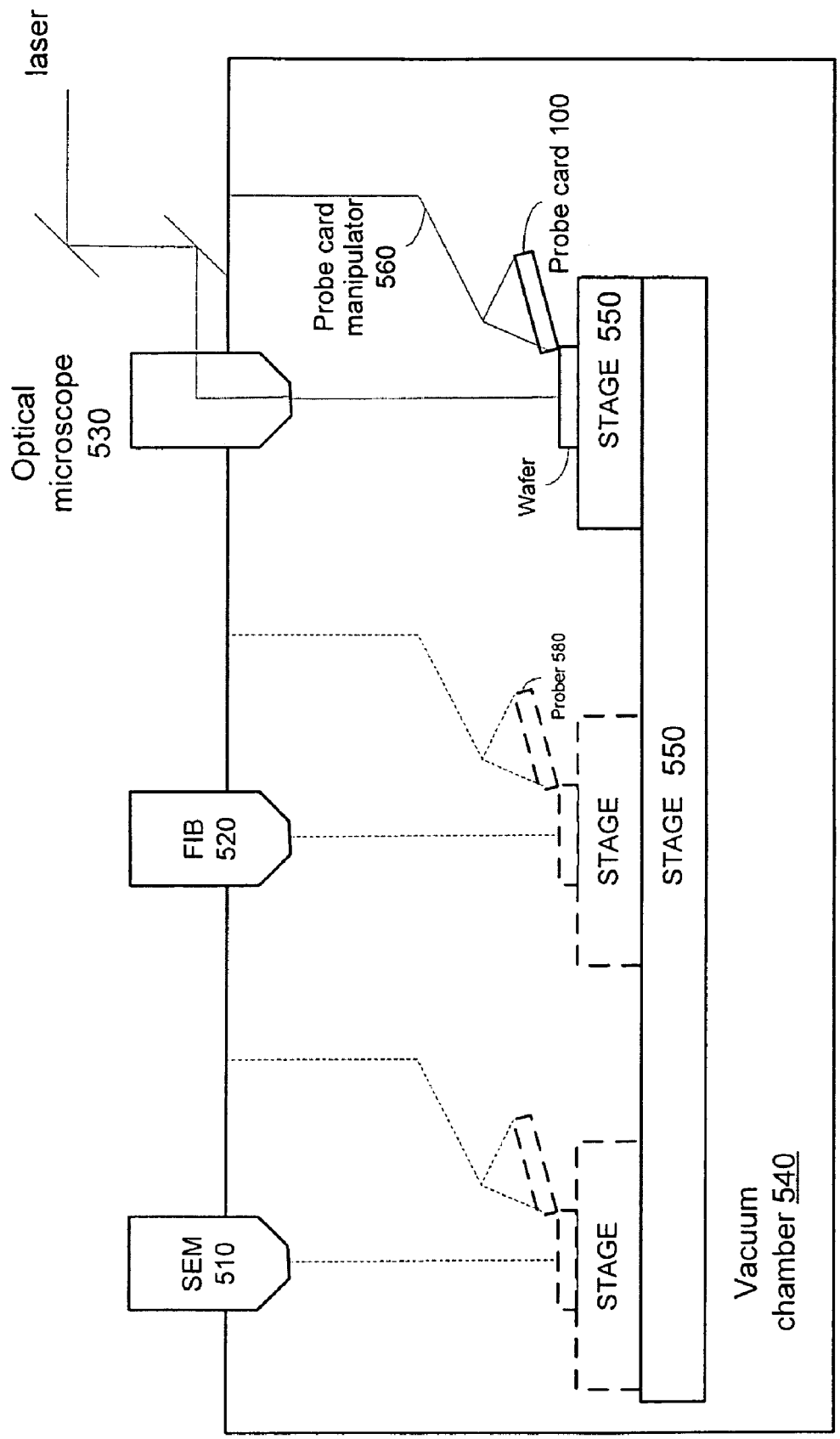
FIG. 10 illustrates a device for defect localization, according to an embodiment of the invention.

FIG. 10 illustrates a device 500 for defect localization, according to an embodiment of the invention.

Device 500 includes a Scanning Electron Microscope (SEM) column 510, a Focused Ion Beam (FIB) column 520, an optical microscope (OM) 530, a stage 550, a probe card manipulator 560 and a vacuum chamber 540.

An focused ion beam generated by the FIB column 520, an electron beam generated by the SEM column 510 and a light beam that is provided by the optical microscope 530 propagate through a vacuum induced by the vacuum chamber 540.

An inspected object, such as a wafer that includes one or more test structures, enters the vacuum chamber 540 and can be subjected to various tests and inspection sessions without exiting the vacuum chamber, thus greatly speeding up the defect localization process. This also reduces the contamination associated with entering and exiting the vacuum chamber.

A probe card manipulator 560 can place a probe card (such as probe card 200 or probe card 100) in locations that allows the probe card to contact the test structure pads of the inspected object while allowing the inspection of the test structure by the FIB column 520, SEM column 510, or the optical microscope 530.

If there is a need to cross section the test structure array of any portion of the wafer, this can be done by FIB column 520, within the vacuum chamber 540.

The wafer can be moved within the vacuum chamber 540 such as to allow it to be imaged, scanned by FIB column 520, SEM column 510. or the optical microscope 530, or to be cross sectioned by the FIB column 520.

For convenience of explanation, FIG. 10 illustrates the probe card as touching a wafer that is placed beneath the optical microscope 530, while dashed lines illustrate other locations of the wafer and probe card. For example, the wafer can be placed beneath the FIB column 520 and be electrically connected to probe card 100 or 200. The same applies for the SEM column 510.

According to other embodiments of the invention, the device can include only a portion of the above mentioned columns and microscope.

For example, if device 500 does not include an optical microscope, the inspection/defect localization sequence can include the following stages: (i) testing the test structure array by SEM column 510. It is assumed that a certain failure is detected. (ii) The probe card is connected to the wafer that is placed beneath the SEM column 510. (iii) The defect is located by utilizing the SEM column 510. This may involve applying an active Voltage Contrast sequence, an EBIC sequence and the like. (iv) Optionally, the defect is cross sectioned (sampled) by the FIB column 520.

According to various embodiments of the invention, device 500 can also include a prober 580, that can be used for simple and fast electrical measurements. The prober 580 can be manipulated by probe card manipulator 560 or by a dedicated prober.

According to various embodiments of the invention, device 500 includes at least two of the following: (i) tester, (ii) defect location device and (iii) defect analysis device. If one of said device is located outside vacuum chamber 540, then it may still provide to other devices various information such as defect location, defect characteristics, measurement results and the like.

Figure 11:
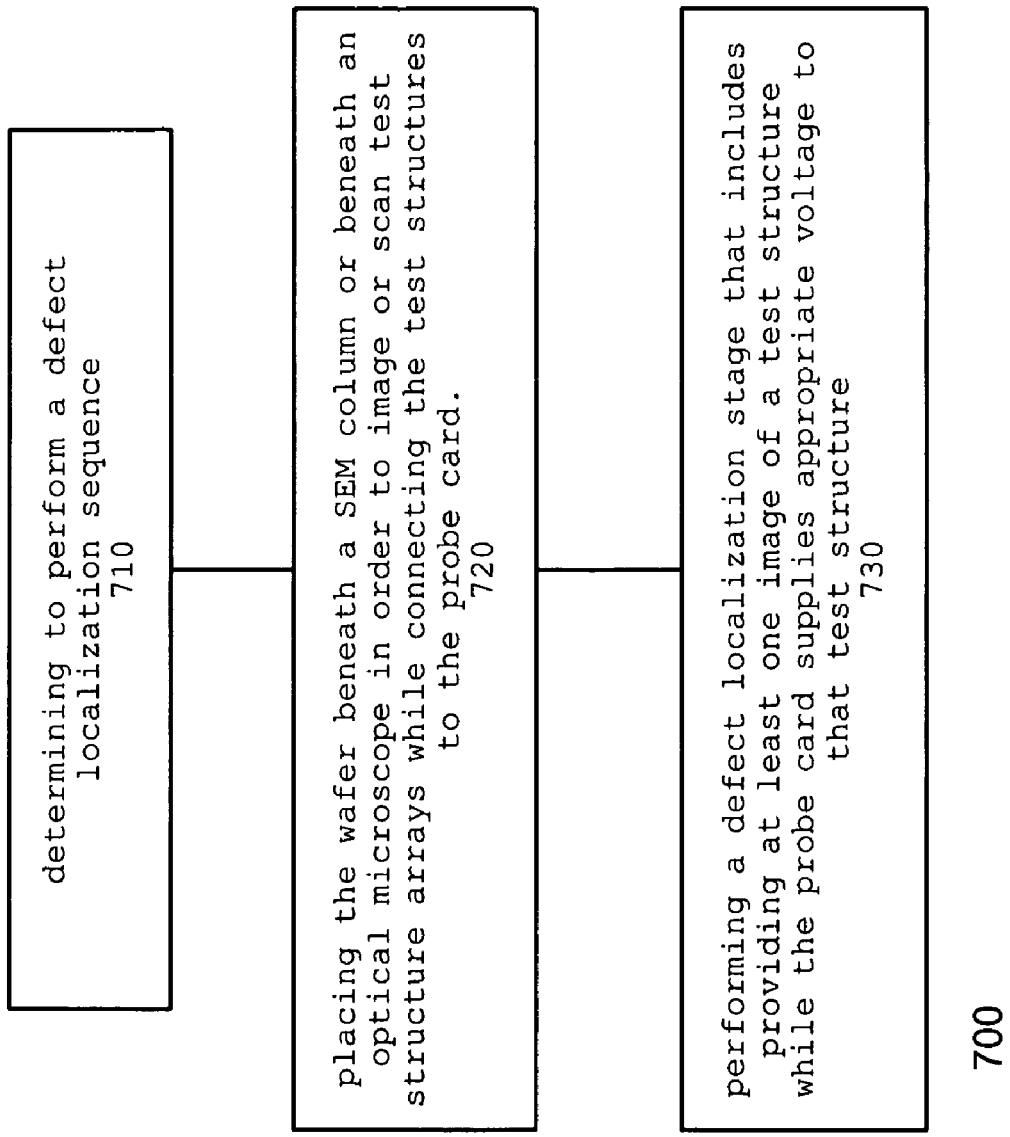
FIG. 11 illustrates a method for defect localization, according to an embodiment of the invention.

FIG. 11 illustrates a method 700 for defect localization, according to an embodiment of the invention.

Method 700 starts by stage 710 of determining to perform a defect localization sequence. Stage 710 usually includes performing a certain electrical test to find that there is a defective test structure. This stage can be performed outside device 500 but this is not necessarily so.

Stage 710 is followed by stage 720 of placing the wafer beneath the SEM column 510 or the beneath the optical microscope 530 in order to image or scan test structure arrays while connecting the test structures to the probe card. The wafer can be placed to the appropriate location by stage 550 and the probe card is placed in proximity to the wafer by probe manipulator 560.

Stage 720 is followed by stage 730 of performing a defect localization stage that includes providing at least one image of a test structure while the probe card supplies appropriate voltage to that test structure. This stage can involve applying any of the well known optical or electrical beam based defect localization methods.

FIG. 12 illustrates method 800 for defect localization, according to another embodiment of the invention.

Method 800 starts by stage 810 of placing an object the comprises a test structure array into a vacuum chamber.

Stage 810 is followed by stage 820 of electrically coupling at least one test structure to a probe card located within the vacuum chamber. Stage 820 is followed by stage 830 of locating a defect within the test structure by inspecting the at least one test structure within the vacuum chamber.

Conveniently, stage 820 includes optical inspection and/or charged particle inspection. The latter can include electron beam inspection as well as ion bean inspection.

Conveniently1 method 800 includes a stage or introducing a relative movement between the probe card and the object such as to couple another test structure to the probe card and locating a defect within the other test structure. According to various embodiments of the invention, the relative movement can be linear, circular or a combination of both.

According to an embodiment of the invention, a method is provided wherein the method includes: (i) determining that a test structure is defective, by a tester; (ii) locating a defect within the defective test structure by a defect localization unit; and (iii) analyzing the defect by an analysis device; wherein the tester, defect localization tool and the analysis device are integrated. Referring to the example set forth in FIG. 10, the defect localization unit is SEM column 510 or optical microscope 530, the analysis device is FIB column 520, and the tester includes prober 580.

The present invention can be practiced by employing conventional tools, methodology and components. Accordingly, the details of such tools, component and methodology are not set forth herein in detail. In the previous descriptions, numerous specific details are set forth, such as shapes of test structures and materials that are electro-optically active, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method for detecting defects in a test structure array using a probe card, said method comprising:
    (a) supplying, by the probe card, at least one electrical signal to a first set of test pads, said first set of test pads being electrically coupled to a first set of test structures, while imaging said first set of test structures; and
    (b) supplying, by the probe card, at least one electrical signal to a second set of test pads, said second set of test pads being electrically coupled to a second set of test structures, while imaging said second set of test structures,
    wherein while supplying the electrical signal to the first set of test pads, the probe card block at least a portion of the second set of test structures from being imaged, while not blocking the first set of test structures from being imaged.

2. The method of claim 1 wherein after imaging of the first set of test structures, the probe card is moved relative to the test structure array, said test structure array comprising the first and second set of test structures and the first and second set of test pads.

3. The method of claim 2 wherein said relative movement is a rotational movement.

4. The method of claim 2 wherein said relative movement is a linear movement.

5. The method of claim 1 wherein the first set of test pads comprises about half of a total number of test pads of the test structure array, said test structure array comprising the first and second set of test structures and the first and second set of test pads.

6. The method of claim 1 wherein the probe card comprises a pin area positioned near a perimeter of the probe card.

7. The method of claim 1 further comprising determining, by a tester, to which test structure array out of multiple test structure arrays to apply the electrical signals.

* * * * *